US006587057B2

(12) United States Patent
Scheuermann

(10) Patent No.: US 6,587,057 B2
(45) Date of Patent: Jul. 1, 2003

(54) HIGH PERFORMANCE MEMORY EFFICIENT VARIABLE-LENGTH CODING DECODER

(75) Inventor: W. James Scheuermann, Saratoga, CA (US)

(73) Assignee: QuickSilver Technology, Inc., San Jose, CA (US)

( * ) Notice: Subject to any disclaimer, the term of this patent is extended or adjusted under 35 U.S.C. 154(b) by 0 days.

(21) Appl. No.: 09/916,161

(22) Filed: Jul. 25, 2001

(65) Prior Publication Data

US 2003/0085822 A1 May 8, 2003

(51) Int. Cl.[7] ........................ H03M 7/40; G06K 9/36; G06K 9/46
(52) U.S. Cl. ......................................... 341/67; 382/246
(58) Field of Search .................. 341/67, 65; 708/203, 708/400; 348/473; 375/240; 709/247; 707/10; 711/108; 382/246

(56) References Cited

U.S. PATENT DOCUMENTS

| 4,899,149 | A | * | 2/1990 | Kahan | 341/67 |
| 5,623,423 | A | * | 4/1997 | Lipovski | 708/203 |
| 5,748,688 | A | | 5/1998 | Kim et al. | |
| 5,748,790 | A | * | 5/1998 | Golin | 382/246 |
| 5,781,135 | A | | 7/1998 | Kim et al. | |
| 5,808,570 | A | * | 9/1998 | Bakhmutsky | 341/65 |
| 5,821,886 | A | * | 10/1998 | Son | 341/67 |
| 5,949,356 | A | | 9/1999 | Kim et al. | |
| 5,969,650 | A | * | 10/1999 | Wilson | 341/67 |

FOREIGN PATENT DOCUMENTS

| WO | WO 93/13603 | 7/1993 |
| WO | WO 96/33558 | 10/1996 |

OTHER PUBLICATIONS

Aggarwal, Manoj, "Efficient Human Decoding," IEEE, 2000, pp. 936–939.

Schneider, Claus, "A Parallel/Serial Trade–Off Methodology for Look–Up Table Based Decoders," DAC 1997, Anaheim, CA, pp. 498–503.

Sriram, Sundararajan, et al., "MPEG–2 Video Decoding on the TMS320C6X DSP Architecture," IEEE, 1998, pp. 1735–1739.

Ishii, Daiji, et al., Parallel Variable Length Decoding with Inverse Quantization for Software MPEG–2 Decoders, IEEE 1997, pp. 500–509.

*MPEG–2 Video Decoding on the TMS320C6X DSP Architecture*, Sundararajan Sriram and Ching–Yu Hung, DSPS R&D Center, Texas Instruments, Dallas TX 75265, 5 pages.

* cited by examiner

*Primary Examiner*—Patrick Wamsley
(74) *Attorney, Agent, or Firm*—Charles J. Kulas; Townsend and Townsend and Crew, LLP

(57) ABSTRACT

A fast, memory efficient, lookup table-based system for VLC decoding. Code words are grouped by prefix and recoded to reduce the number of bits that must be matched, thus reducing the memory requirements. General-purpose processor and finite state machine decoder implementations are described.

9 Claims, 6 Drawing Sheets

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| done | codeword type | | leader 0 to 6 | | | b 0 to 4 | | | recode prefix 7-bit code | | | | | | |

Data Format for the Auxiliary Tables

FIG. 3A

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| rsvd. | length* 2 to 17 | | | | run 0 to 31 | | | | | | level 1 to 40 | | | | |

Data Format for the Token Memory

* length = (value of bits [14:11]) + 2

FIG. 3B

HIGH PERFORMANCE MEMORY EFFICIENT VARIABLE-LENGTH CODING DECODER

BACKGROUND OF THE INVENTION

This invention relates in general to digital decoding and more specifically to a decoding system especially suited for MPEG-type decoding.

The Moving Pictures Experts Group (MPEG) standards of compression have gained wide popularity. The MPEG standards are used extensively in digital audio and image compression, encoding, transfer and decoding and decompression. Copies of the standards are available from many sources. On such source is the MPEG home page at http://www.cselt.it/mpeg/.

Implementing the MPEG standard in a computer, server, consumer electronic device, or other digital system can be daunting because of the enormous bandwidth and throughput requirements of today's MPEG content. Devices that play back MPEG content must be very fast. Often such devices are restricted to very limited resources. Thus, any improvements in efficiency in implementing various aspects of the MPEG standard are welcome and valuable.

One MPEG standard function that can greatly benefit from improvement is MPEG decoding. MPEG decoding occurs at the time of playback of MPEG content. This often means that the decoder is executing in a consumer electronic device with very limited resources. For example, such consumer electronics devices often have simple, slower processors that are also used for other tasks in the device. The amount of memory, or other storage, is limited and is needed by other tasks or features in the device.

A significant portion of MPEG decoding involves decoding bitstreams that represent audio or image content (or both). A bitstream includes variable length coding (VLC) code words. Each code word is a variable number of bits. One use of VLC code words is to decode discrete cosine transform coefficients. In this case, each code word indicates (1) the number of zeros before the next coefficient (the "run"), (2) the value of the next coefficient (the "level") and (3) how to obtain the next code word in the bitstream (i.e., the "length" of the present code word).

Table I, below, shows selected VLC code words used to decode DCT coefficients. A complete set of VLC code words can be found in the MPEG standards. In Table I, "run" indicates the number of zeros until the next non-zero coefficient and "level" is the value of the coefficient. There are 114 code words for this particular example.

TABLE I

| Variable length code | [a] | run | level |
|---|---|---|---|
| 10 | [b] | end of block | |
| 1s | [c] | 0 | 1 |
| 11s | [d] | 0 | 1 |
| 011s | | 1 | 1 |
| 0100 s | | 0 | 2 |
| 0101 s | | 2 | 1 |
| 0010 1s | | 0 | 3 |
| 0011 1s | | 3 | 1 |
| 0011 0s | | 4 | 1 |
| ... | | | |
| 0000 0000 0001 1110 | s | 28 | 1 |
| 0000 0000 0001 1101 | s | 29 | 1 |

TABLE I-continued

| Variable length code | [a] | run | level |
|---|---|---|---|
| 0000 0000 0001 1100 | s | 30 | 1 |
| 0000 0000 0001 1011 | s | 31 | 1 |

Notes:
[a] The last bit 's' denotes the sign of the level, '0' for positive and '1' for negative.
[b] "End of Block" shall not be the only code of the block.
[c] This code shall be used for the first (DC) coefficient in the block.
[d] This code shall be used for all other coefficients.

Run-level pairs that occur more frequently are assigned short code words while those occurring less frequently are assigned long code words, effectively compressing the data since the more frequent shorter code words dominate. Only the codes with high probability of occurrence are coded with a VLC. Less probable events are coded with an escape symbol followed by fixed length codes.

The basic idea of VLC decoding is to match bit patterns of an incoming bitstream against a codebook containing all of the allowed bit patterns. A simple decoding algorithm would check the bitstream one bit at a time until a matching pattern was found. For most applications, such an approach is far too slow to be practical; and, commonly, decoding speed is increased by matching multiple bits at a time using lookup tables.

Programmable processors are frequently employed for VLC decoding, but they are relatively inefficient because of their fixed word sizes as well as their modest shifting and bit testing capabilities.

Many approaches exist for decoding VLC encoded coefficients. See, e.g., "MPEG-2 Video Decoding on the TMS320C6X DSP Architecture," Sundararajan Sriram, and Ching-Yu Hung.

SUMMARY OF THE INVENTION

The present invention provides a fast, memory efficient, lookup table-based system for VLC decoding. Code words are grouped by prefix and recoded to reduce the number of bits that must be matched, reducing the memory requirements. General-purpose processor and finite state machine (FSM) decoder implementations are described.

BRIEF DESCRIPTION OF THE DRAWINGS

FIG. 3A shows the data format for the auxiliary tables;

FIG. 3B shows the data format for a token memory;

DESCRIPTION OF A PREFERRED EMBODIMENT

The invention is discussed herein primarily with respect to MPEG decoding. Specifically, examples are illustrated using a specific set of MPEG-2 DCT coefficient VLC code words. The complete MPEG-2 standard includes other types of decoding that can be aided by the present invention. The MPEG-2 standard can be found, e.g., at http://www.cselt.it/ mpeg/standards/mpeg-2/mpeg-2.htm. The MPEG-2 standard is hereby incorporated by reference as if set forth in full in this document. It should be apparent that aspects of the invention are suitable for use in other MPEG standards, other encoding/decoding, compression/decompression (codec) standards and in other aspects of digital processing, in general.

SUMMARY

Figure 6:
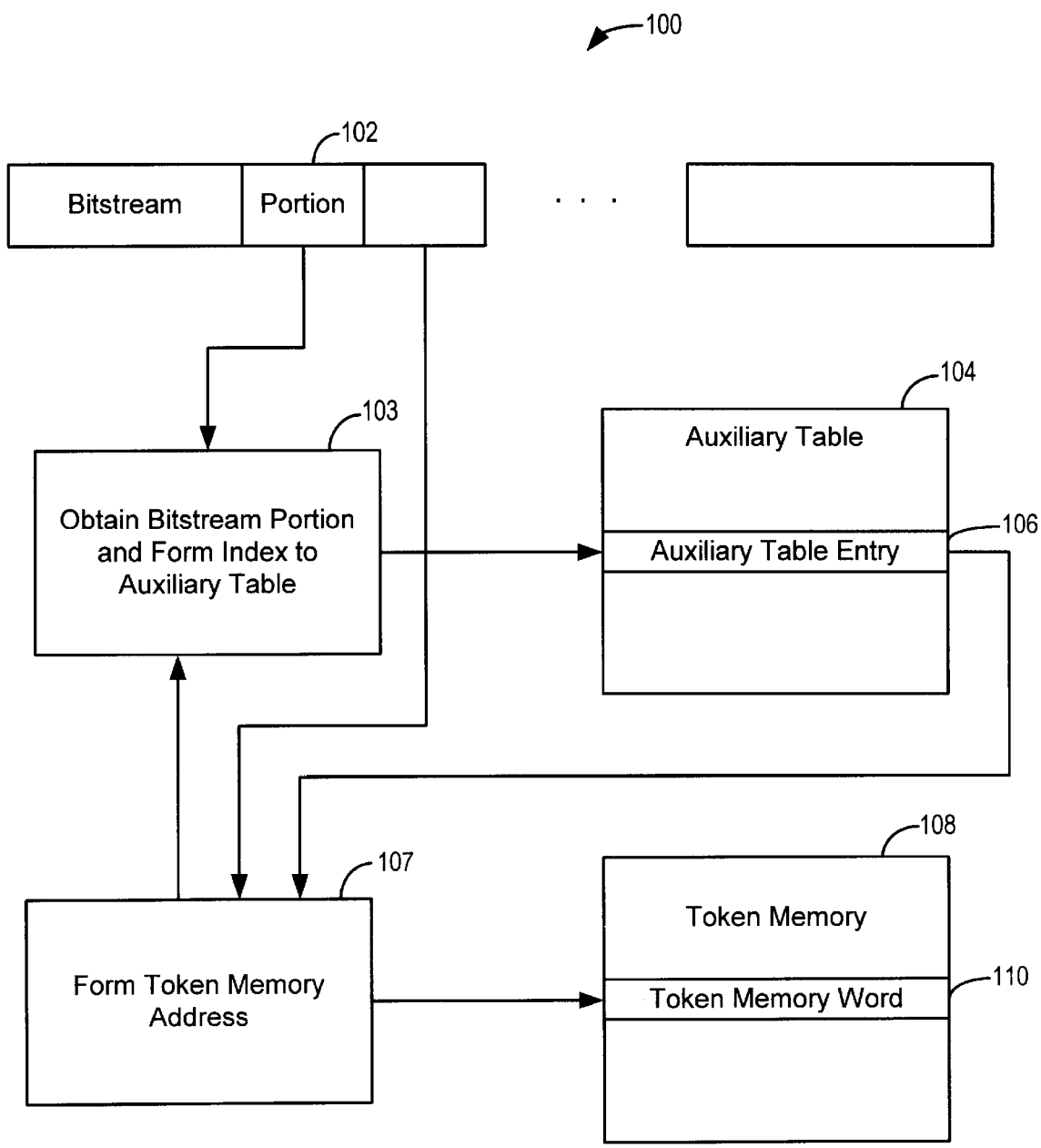
FIG. 6 illustrates a summary of the basic processing and data structures of the invention.

FIG. 6 illustrates a summary of the basic processing and data structures of the invention.

In FIG. 6, a predetermined number of bits are obtained as portion 102 from MPEG bitstream 100. In a preferred embodiment of the invention, the portion size is 6 bits. The bitstream portion is obtained and used by process 103 to index auxiliary table 104 to obtain auxiliary table entry 106. Auxiliary table 104 is an array of 64 16-bit words. Each entry, or word, in the auxiliary table provides information to access token memory 108. Additionally, other information such as hit/miss indication, EOB, recoding information, etc., as described above, can be included.

Process 107 represents a step, or series of steps, using auxiliary table entries and bitstream bits to form a token memory address. In forming a token memory address it may be necessary to obtain other bitstream portions and additional bitstream data, and to perform additional table accesses. A preferred embodiment of the invention uses two tables of the same size to implement the DCT coefficient decoding.

Once a token memory address is formed it is used to access token memory 110 to obtain token memory word 108. The token memory addressing is based on an advantageous recoding of VLC code words, as described below. Token memory 110 is an array of 128 entries (only 112 of which are actually used) of 16 bits in width. Each token memory word includes the run, length and level associated with a VLC code word in the bitstream. Note that the sizes of bitstream portions and word widths, tables, memories, arrays, etc., can vary from those discussed herein. With the present example, it can be seen that the invention uses less than 512 bytes of memory to decode the MPEG DCT coefficient VLC code words. Also, the processing steps represented by processes 103 and 107 are simple operations that are quickly executed, as shown below.

DETAILED DESCRIPTION

A complete list of the VLC code words, a portion of which are shown in Table I, can be found in ISO/IEC 13818-2: 1995 (E) Recommendation ITU-T H.262 (1995 E), on page 162. The entirety of this document is hereby incorporated by reference as if set forth in this application for all purposes.

In the complete table there are 114 code words. The shortest code word has a length of 2 bits, and the longest code words have lengths of 17 bits. Decoding these code words with a brute force 2^17 entry lookup table is not a viable solution. Prior art decoding systems commonly employ a hierarchy of lookup tables requiring a few thousand bytes of memory.

The decoding algorithm utilizes an auxiliary table to facilitate code word recoding with the fewest possible number of bits. For the present example, there are 114 code words in the table. The code words can be recoded by the theoretically fewest number of bits—seven for this example.

First, the 114 code words from Table I are grouped by common prefixes as shown in Table II.

TABLE II

Grouping Code Words with Common Prefixes

| Code Word | Common Prefix |
|---|---|
| 10 | 10 |
| 1s | 1 |
| 11s | 11 |
| 011s | 011 |
| 010b s | 010 |
| 001b bs | 001 |
| 0001 bbs | 0001 |
| 0000 1bbs | 0000 1 |
| 0000 01 | 0000 01 |
| 0010 0bbb s | 0010 0 |
| 0000 001b bbs | 0000 001 |
| 0000 0001 bbbb s | 0000 0001 |
| 0000 0000 1bbb bs | 0000 0000 1 |
| 0000 0000 01bb bbs | 0000 0000 01 |
| 0000 0000 001b bbbs | 0000 0000 001 |
| 0000 0000 0001 bbbb s | 0000 0000 0001 |

Next, code words are recoded with fixed length code words that require the fewest possible number of bits (seven for this example since there are 112 code words) as shown in Table III, below. The "end of block" code word, '10', and the "escape" code word, '0000 01', are not recoded. Instead they are decoded using appropriate entries in the auxiliary tables, described below. Note that the "s" bit (indicating sign of the coefficient) has been truncated since it is always implied.

TABLE III

Proposed Fixed, Minimum Length Recoding

| Code Word | Prefix | Recoded Code Word | |
|---|---|---|---|
| 1s | 1 | 000 0000 | 1 value |
| 11s | 11 | 000 0001 | 1 value |
| 011s | 011 | 000 0010 | 1 value |
| 010b s | 010 | 000 010b | 2 values |
| 001b bs | 001 | 000 10bb | 3 values |
| 0001 bbs | 0001 | 000 11bb | 4 values |
| 0000 1bbs | 0000 1 | 001 00bb | 4 values |
| 0010 0bbb s | 0010 0 | 010 0bbb | 8 values |
| 0000 001b bbs | 0000 001 | 010 1bbb | 8 values |
| 0000 0001 bbbb s | 0000 0001 | 011 bbbb | 16 values |
| 0000 0000 1bbb bs | 0000 0000 1 | 100 bbbb | 16 values |
| 0000 0000 01bb bbs | 0000 01 | 101 bbbb | 16 values |
| 0000 0000 001b bbbs | 0000 0000 001 | 110 bbbb | 16 values |
| 0000 0000 0001 bbbb s | 0000 0000 0001 | 111 bbbb | 16 values |

The above total 112 values. Two additional values are used for "End Of Block" and "Escape" codes for a total of 114 values.

Auxiliary tables are used to supply the necessary recoding information along with "end of block", "escape", and "error code word" indications.

Auxiliary Table Memory

The VLC decoding process begins by reading N bits from the start of the input bitstream. The N bits are used to index an auxiliary table memory. The auxiliary table memory returns indications of whether the N bits contain at least one VLC; any EOB, ESCAPE, or ERROR indication; and recoding information.

When the N bits contain only a partial prefix pattern for a VLC longer than N bits, the next N bits from the input bitstream are used to index a second auxiliary table, and so on until a complete VLC prefix pattern has been matched.

For the present example, N=6. As will be shown, this requires only two 64-entry auxiliary tables. The data format for the auxiliary tables is shown in FIG. 3A.

The fields for the auxiliary table entries are as follows:

Auxiliary Table Recode Prefix—Bits [6:0]. Three or more of the upper order bits of the 7-bit recode prefix (p-bits) are concatenated with zero, one, two, three or four bitstream bits (b-bits) to form a 7-bit token memory address. The number of upper-order recode prefix bits (p-bits) used will be: number_p_bits=7—number_of_b_bits Auxiliary Table Number of Bitstream Bits—Bits [9:7]. These bits indicate the total number of bitstream b-bits which will be concatenated with three or more bits of the recode prefix in the recode prefix field.

Auxiliary Table Number of Leader Bits—Bits [12:10]. Bits [12:10] encode the number of leader bits (1-bits) in the lookup table address/code word prefix, thereby indicating the location of the first b-bit (if any).

Auxiliary Table Code Word Type—Bits [14:13]. Bits [14:13] encode the type of code word that has been matched, if any.

| Bit 14 | Bit 13 | Indication |
|---|---|---|
| 0 | 0 | code word prefix bit pattern matched |
| 0 | 1 | "errored" code word detected |
| 1 | 0 | "end of block" code word detected |
| 1 | 1 | "escape" code word detected |

Auxiliary Table Code Word Match—Bit 15. Bit 15 will be set to 1 to indicate a code word prefix match or an error. No additional access is required. Bit 15 will be set to 0 to indicate that neither a match nor an error has been detected and that an additional access will be required to match a code word prefix.

Auxiliary Table Memory Contents

This section summarizes the contents of the auxiliary tables for all code word groupings and the resulting 7-bit recoding used to index the 112-entry token memory. Note that the "0b" prefix indicates a binary number while the "0x" prefix indicates a hexadecimal number.

| nomenclature | |
|---|---|
| address_1 | the 6-bit address to the first auxiliary table |
| address_2 | the 6-bit address to the second auxiliary table (if required) |
| returned | the 16-bit value returned from an auxiliary table |
| token memory address | the 7-bit recoded code word (according to Table III). |

[40] Code Word 10 (EOB: shall not be the only code of the block)

address_1  0b  '10xxxx'
    returned    0x  C800

[41] Code Word Prefix 1 (only may be used for first (DC) coefficient in the block)

address_1  0b             '1xxxxx'
    returned    0x            xxxx       ; don't care
    token memory address  0b'0000000' ; forced by hardware

[42] Code Word Prefix 11 address_1  0b'11xxxx'
    returned    0x8801
    token memory address     0b'0000001'
    Note that coding rules as defined in the MPEG standards disambiguate code word prefixes '10', '1' and '11'.

[43] Code Word Prefix 011 address_1  0b'011xxx'
    returned    0x8C02
    token memory address     0b'0000010'

[44] Code Word Prefix 010b address_1  0b'010bxx'
    returned    0x8C84     ; 0b'100 011 001 0000100'
                                         ; code word=1; prefix bit pattern matched
                                         ; leader=3
                                         ; b=1
                                         ; recode prefix=0x04
    token memory address     0b'000010b'

[45] Code Word Prefix 001b b address_1  0b'001bbx'
    returned    0x8D08     ; 0b'100 011 010 0001000'
                                         ; code word=1; prefix bit pattern matched
                                       ; leader=3
                                       ; b=2
                                     ; recode prefix=0x08
    token memory address     0b'00010bb'

-continued

[46] Code Word Prefix 0001 bb address_1   0b'0001bb'
    returned    0x910C      ; 0b'100 100 010 0001100'
    token memory address   0b'00011bb'

[47] Code Word Prefix 0000 1bb address_1   0b'00001b'
    returned    0x9510      ; 0b'100 101 010 0010000'
    token memory address   ; 0b'00100bb'

[48] Code Word 0000 01 (Escape)

address_1   0b'000001'
    returned    0xE000

[49] Code Word Prefix 0010 0bbb address_1   0b'00100b'
    returned    0x95A0      ; 0b'100 101 011 0100000'
    token memory address   0b'0100bbb'

[50] Code Word Prefix 0000 001b bb address_1   0b'000000'
    returned    0x0000      ; code word=0 (second access required)
    address_2   0b'1bbbxx'
    returned    0x8598      ; 0b'100 001 011 0101000'
    token memory address   0b'0101bbb'

[51] Code Word Prefix 0000 0001 bbbb address_1   0b'000000'
    returned    0x0000      ; code word=0 (second access required)
    address_2   0b'01bbbb'
    returned    0x8A30      ; 0b'100 010 100 0110000'
    token memory address   0b'011bbbb'

[52] Code Word Prefix 0000 0000 1bbb b address_1   0b'000000'
    returned    0x0000      ; code word=0 (second access required)
    address_2   0b'001bbb'
    returned    0x8E40      ; 0b'100 011 100 1000000'
    token memory address   0b'100bbbb'

[53] Code Word Prefix 0000 0000 01bb bb address_1   0b0000000'
    returned    0x0000      ; code word=0 (second access required)
    address_2   0b'0001bb'
    returned    0x9250      ; 0b'100 100 100 1010000'
    token memory address   0b'101bbbb'

[54] Code Word Prefix 0000 0000 001b bbb address_1   0b'000000'
    returned    0x0000      ; code word=0 (second access required)
    address_2   0b'00001b'
    returned    0x9660      ; 0b'100 101 100 1100000'
    token memory address   0b'110bbbb'

[55] Code Word Prefix 0000 0000 0001 bbbb address_1   0b'000000'
    returned    0x0000      ; code word=0 (second access required)
    address_2   0b'000001'
    returned    0x9A70      ; 0b'100 110 100 1110000'
    token memory address   0b'111bbbb'

Token Memory

The 7-bit recoded code word is used to index the 112-entry token memory. The token memory returns the value of the non-zero coefficient, the run length of zero-valued coefficients between this and the previous non-zero value coefficient, and the length of this VLC. The data format for the token memory is shown in FIG. 3B.

Note that the length of the VLC can also be calculated during the recoding process which might speed the decoding process for certain implementations. It can be calculated from the following formula: VLC length=leader_bits+b_bits+1. where, for a single auxiliary table access, leader_bits 1, the number of leader bits returned from the first auxiliary table, and for two auxiliary table accesses, leader_bits=(1+6), where "1" is the additional number of leader bits returned from the second auxiliary table and the "+6" is inferred; b_bits=b, the number of bitstream bits returned from an auxiliary table; and the "+1" term accounts for the implied "s" bit. After each successful VLC decode, the bitstream position pointer is advanced by an amount equal to "VLC length" to prepare for the decoding of the next VLC.

VLC Decoding Examples

Figure 1:
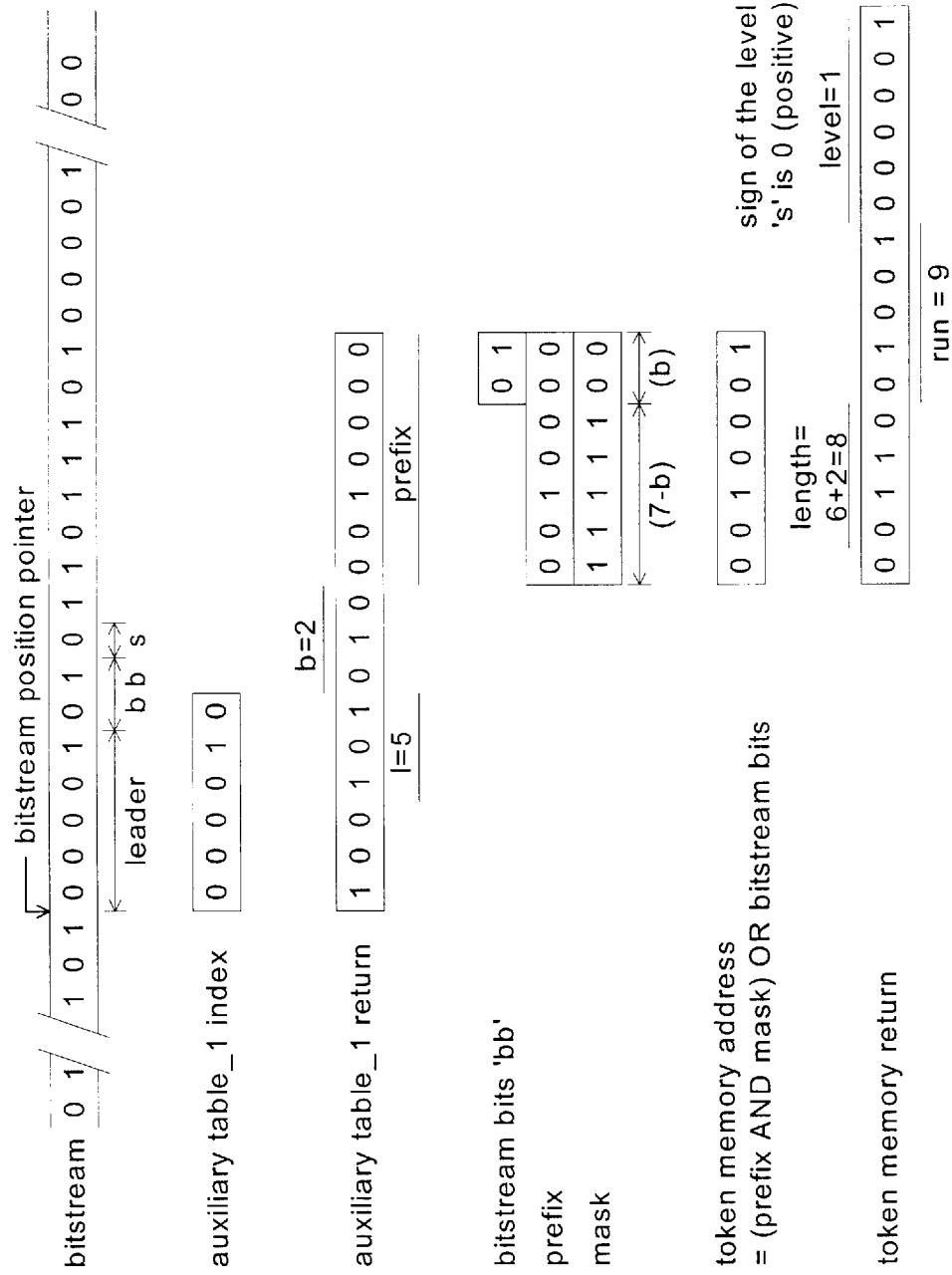
FIG. 1 shows a decoding process using a single auxiliary table access.
Figure 2:
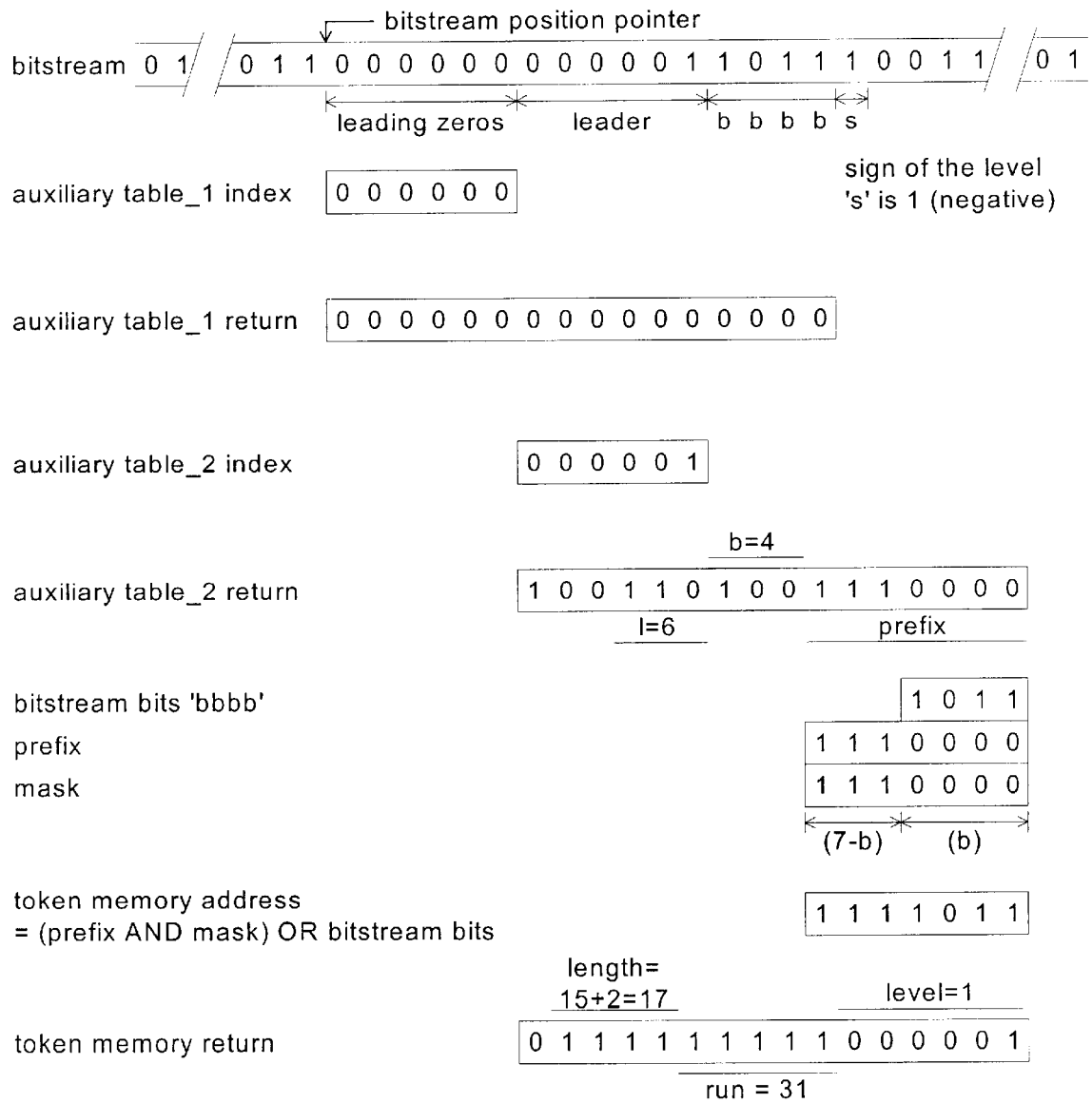
FIG. 2 illustrates a decoding example requiring two auxiliary table accesses.

Two VLC decoding examples are next discussed in reference to FIGS. 1 and 2, respectively.

VLC Decoding Example 1

FIG. 1 shows a decoding process using a single auxiliary table access. A description of decoding in relation to FIG. 1 is as follows: From the bitstream position pointer, the next six bits are used for the auxiliary table index. The auxiliary table returns an indication that the VLC can be decoded from the accompanying recoding information: l=5, b=2 and recode prefix=0×10. The token memory address is formed from the upper (7-b)=5 bits of the recode prefix concatenated with b=2 bitstream bits displaced l=5 bits from the bitstream position pointer. The token memory returns the VLC length= 8, run length=9 and non-zero coefficient level=1. The sign bit is displaced from the bitstream position pointer by "VLC length"=8 bits, or, alternatively, (l+b+1)=8 bits. The sign bit, s, is 0 (positive).

VLC Decoding Example 2

FIG. 2 illustrates a decoding example requiring two auxiliary table accesses because the first six bits following the bitstream position pointer are zero, a code word partial prefix. A description of decoding in relation to FIG. 2 is as follows: From the bitstream position pointer, the next six bits, one through six, are used for the auxiliary table index. The auxiliary table returns an indication that the VLC cannot be decoded because the index is '000000', a code word partial prefix. From the bitstream position pointer, the next six bits, seven through twelve, are used for the index to a second auxiliary table. The second auxiliary table returns an indication of a code word prefix match, along with the recoding information: l=6, b=4 and recode prefix=0×70. The token memory address is formed from the upper (7-b)=3 bits of the recode prefix concatenated with the b=4 bitstream bits that are displaced (6 leading zeros +[l=6]=12) bits from the bitstream position pointer. The token memory returns the VLC length=17, run length=31 and non-zero coefficient level=1. The sign bit is displaced from the bitstream position pointer by "VLC length"=17 bits, or, alternatively, (6+1+b+ 1)=17 bits. The sign bit, s, is 1 (negative).

Recoding a Second ISO/IEC DCT Coefficients Table

MPEG2 uses a second 113 element Huffman-like table for DCT coefficients. This table can be found in ISO/IEC 13818-2: 1995 (E) Recommendation ITU-T H.262 (1995 E), at page 166. This table also can be recoded with 7-bit fixed length codes as shown in Table IV, below.

TABLE IV

Proposed Fixed, Minimum Length Recoding

| Code Word | Prefix | Recoded Code Word | |
|---|---|---|---|
| 10s | 10 | 000 0000 | 1 value |
| 010s | 010 | 000 0001 | 1 value |
| 110s | 110 | 000 0010 | 1 value |
| 0111 s | 0111 | 000 0011 | 1 value |
| 001b bs | 001 | 000 01bb | 3 values |
| 1110 bs | 1110 | 000 100b | 2 values |
| 0001 bbs | 0001 | 000 11bb | 4 values |
| 1111 bbbs | 1111 | 001 1bbb | 5 values |
| 0000 1bbs | 0000 1 | 001 00bb | 4 values |
| 1111 1bbb s | 1111 1 | 010 1bbb | 6 values |
| 0010 0bbb s | 0010 0 | 010 0bbb | 8 values |
| 0000 001b bs | 0000 001 | 001 01bb | 3 values |
| 0000 0011 0bs | 0000 0011 0 | 000 101b | 2 values |
| 0000 0001 bbbbs | 0000 0001 | 011 bbbb | 10 values |
| 0000 0000 1bbb bs | 0000 0000 1 | 100 bbbb | 12 values |
| 0000 0000 01bb bbs0000 0000 01 | | 101 bbbb | 16 values |
| 0000 0000 001b bbbs0000 0000 001 | | 110 bbbb | 16 values |
| 0000 0000 0001 bbbb s0000 0000 0001 | | 111 bbbb | 16 values |

Again, we observe that grouping the codewords by prefix and recoding reduces the maximum number of bits required for pattern matching (from 17 to 12 for these examples), reducing the required lookup table memory proportionately.

Note for these two examples that there is one, and only one, 6-bit partial prefix code, '0000 00,' which, when concatenated with a second 6-bit partial prefix code, unconditionally will match all longer code prefix bit patterns, so that two 64-entry auxiliary tables will be sufficient. Of course, additional auxiliary tables would be required for additional partial prefix codes; or, alternatively, N can be increased until there is, again, a single partial prefix code from which a second auxiliary table can complete the matching process.

In certain decoder implementations, one may choose to employ partial prefix code comparators or fixed-pattern decoders (6-bit zero detector for these examples) to speed the execution time.

VLC Decoder Implementation

Figure 4:
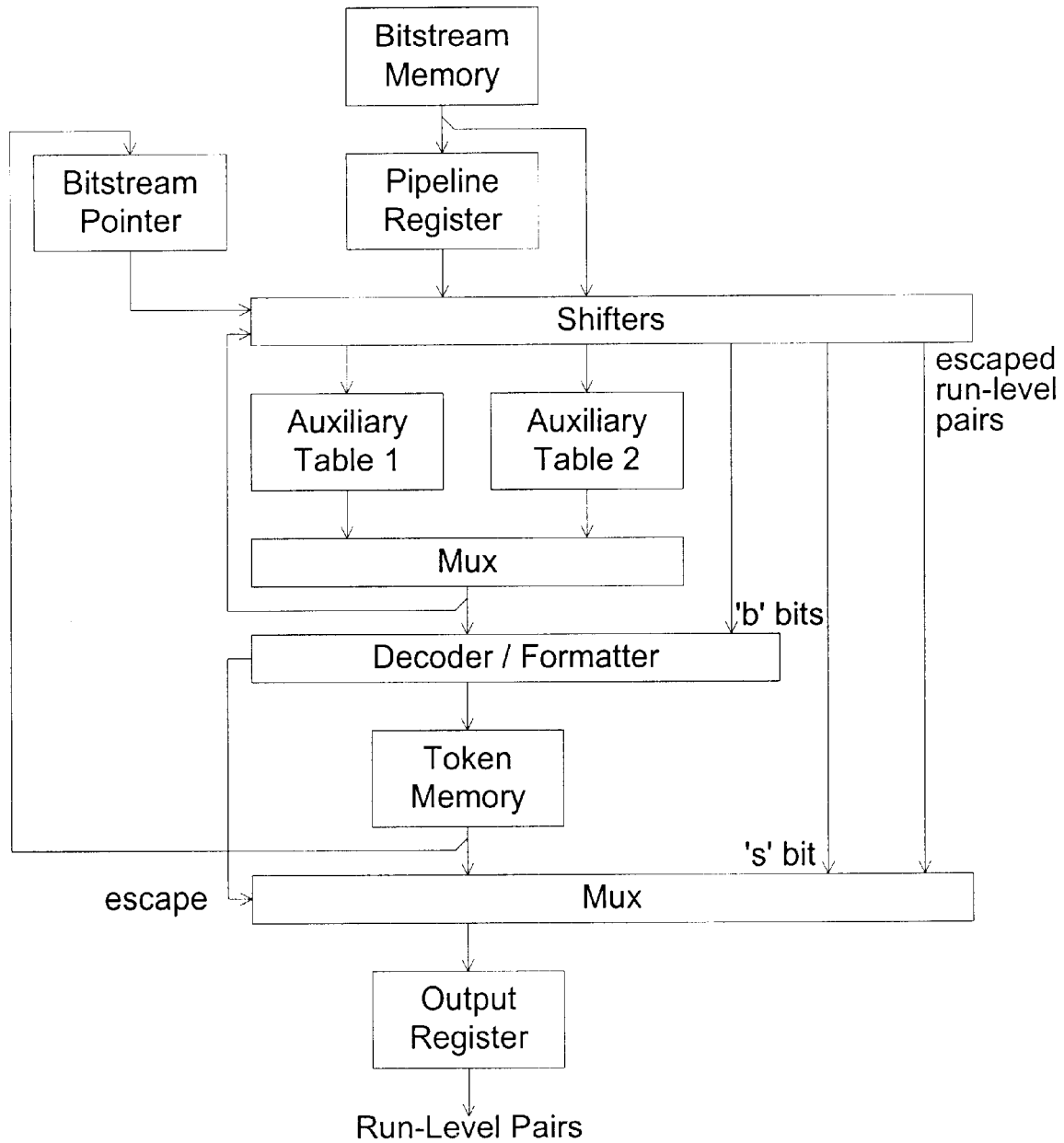
FIG. 4 shows a block diagram for an exemplary high performance decoder hardware implementation.

FIG. 4 shows a block diagram for an exemplary high performance decoder hardware implementation. Hardware implementations for a decoder according to the present invention can vary. In general, blocks representing components, circuits, functionality, etc., can be added to, or taken from, the block diagram of FIG. 4. The functionality of FIG. 4 can be modified and can be achieved by many different designs.

In the design of FIG. 4, both auxiliary tables are accessed concurrently for increased performance and their returns are multiplexed conditionally on the "code word=0" bit from the first auxiliary table. Additionally, the token memory address generator and the token memory are combinational logic elements between the bitstream memory/pipeline register and the output register for the run-level pairs.

This implementation decodes one VLC symbol each processor clock period. Assuming an average VLC length of 4 bits and a processor clock frequency of 50 MHz, this implementation could decode real time bitstreams at rates approaching 200 Mbits/s. Or, as a time-shared resource, it could decode 10 Mbits/s bitstreams while operating at a leisurely 5% duty cycle.

Another implementation might use one physical memory for both auxiliary tables and the token memory. With the conservative assumption of an equal probability of one or two auxiliary table accesses per VLC, such an implementation would have 40% of the capacity of the higher performance implementation, enabling it to decode real time bitstreams at rates approaching 80 Mbits/s, or 10 Mbits/s bitstreams while operating at a 12.5% duty cycle.

Figure 5:
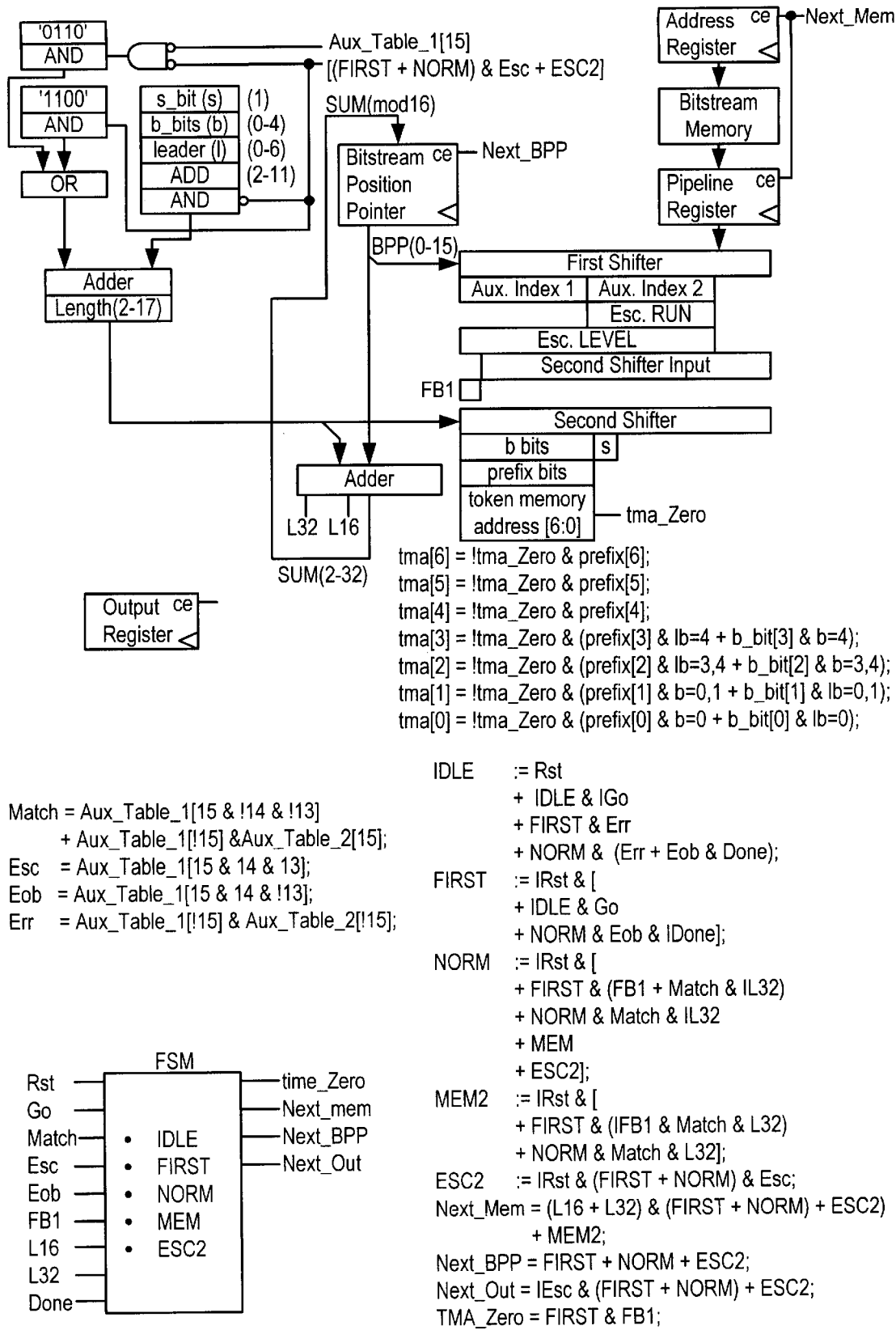
FIG. 5 shows a finite state machine control system.

FIG. 5 shows a finite state machine (FSM) control suitable for the designs discussed above, in connection with FIG. 4. Another embodiment can use a lower-performance implementation of the approach of the present invention executing on other more general-purpose architecture with a predetermined instruction set.

Although the invention has been described with respect to specific embodiments, the embodiments are merely illustrative, and not restrictive, of the invention. For example, systems that embody the present invention can use different formats, fields, numbers of bits, numbers of entries, etc., for the auxiliary tables and memory layouts presented herein. Many programming and data structure designs and techniques can be employed to achieve suitable embodiments of the invention. Different portions of the design can be executed in hardware, or software, as desired.

Thus, the scope of the invention is to be determined solely by the appended claims.

What is claimed is:

1. A method for decoding values from a bitstream, wherein the bitstream includes code words having prefixes, the method comprising obtaining a first number of bits from the bitstream, wherein the first number of bits includes at least a portion of a first code word;

using the first number of bits to obtain a first entry in a table, wherein the first entry includes information to generate an address to an array, wherein the array address includes a bit field having values corresponding to prefixes in the code words, wherein the bit field width is smaller than at least one prefix width, the first entry further including an indication of whether the first number of bits includes a complete code word;

checking the first table entry to determine that the first number of bits does not include a complete code word and, if so, performing steps of obtaining an additional number of bits from the bitstream; and using the additional number of bits to iteratively obtain entries from the table until a complete code word is obtained; and using the array address to obtain an entry to decode the first code word.

2. The method of claim 1, wherein the bitstream is an MPEG-compliant bitstream.

3. The method of claim 2, wherein the code words are encoded as variable length codes in accordance with an MPEG-2 standard.

4. The method of claim 3, wherein the code words are used to decode discrete cosine transform coefficients.

5. The method of claim 1, further comprising obtaining a second number of bits from the bitstream;

using the second number of bits to obtain a second entry in a second table; and using at least a portion of both the first and second entries to generate an address to the array.

6. A method for decoding code words in a bitstream, wherein the code words include prefixes having widths, the method comprising obtaining a first number of bits from the bistream, wherein the first number of bits includes less than a complete code word;

using a table to obtain an entry, wherein the table is addressed according to a recoding of the code words, wherein the recoding of the code words includes a bit field having values corresponding to prefixes in the code words, wherein the bit field width is smaller than at least one prefix width, wherein the entry indicates whether the first number of bits includes a complete code word; and iteratively obtaining subsequent numbers of bits from the bitstream and using the subsequent numbers of bits to obtain subsequent entries from the table until a subsequent entry indicates that a complete code word has been obtained from the bitstream.

7. An apparatus for decoding code words in a bitstream, wherein the code words include prefixes having widths, the apparatus comprising a table stored in a storage medium;

a memory access circuit for accessing the table in the storage media by using a recoding of the code words, wherein the recoding of the code words includes a bit field having values corresponding to prefixes in the code words, wherein the bit field width is smaller than at least one prefix width; and wherein the table includes entries indicating whether the first number of bits includes a complete code word, and for indicating whether combined subsequent additional bits from the bitstream include a complete code word.

8. The apparatus of claim 7, wherein the apparatus includes a finite state machine.

9. The apparatus of claim 7, wherein the apparatus includes a general-purpose digital processor.

* * * * *